(12) United States Patent
Okuyama et al.

(10) Patent No.: US 10,677,819 B2
(45) Date of Patent: Jun. 9, 2020

(54) CURRENT SENSOR

(71) Applicant: Hitachi Metals, Ltd., Tokyo (JP)

(72) Inventors: Ken Okuyama, Tokyo (JP); Naoki Futakuchi, Tokyo (JP); Haruyasu Komano, Tokyo (JP); Jun Umetsu, Tokyo (JP); Yujiro Tomita, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 62 days.

(21) Appl. No.: 16/156,033

(22) Filed: Oct. 10, 2018

(65) Prior Publication Data

US 2019/0170794 A1 Jun. 6, 2019

(30) Foreign Application Priority Data

Dec. 5, 2017 (JP) ................................. 2017-233680

(51) Int. Cl.
*G01R 15/20* (2006.01)
(52) U.S. Cl.
CPC .......... *G01R 15/207* (2013.01); *G01R 15/205* (2013.01)
(58) Field of Classification Search
CPC ............................ G01R 15/207; G01R 15/205
USPC .................. 324/117 R, 76.11, 76.75
See application file for complete search history.

(56) References Cited

U.S. PATENT DOCUMENTS

| 2018/0350515 | A1* | 12/2018 | Okamoto | G01R 31/40 |
| 2019/0094272 | A1* | 3/2019 | Kawaguchi | G01R 15/202 |
| 2019/0170793 | A1* | 6/2019 | Okuyama | G01R 15/207 |

FOREIGN PATENT DOCUMENTS

JP 2016-200438 A 12/2016

* cited by examiner

*Primary Examiner* — Giovanni Astacio-Oquendo
(74) *Attorney, Agent, or Firm* — Scully, Scott, Murphy & Presser, PC

(57) ABSTRACT

A current sensor includes two bus bars, each of which is formed in a plate shape, the two bus bars being aligned and arranged so as to be spaced apart from each other in a plate width direction thereof, and magnetic detection element arranged opposite the two bus bars, respectively, in a plate thickness direction of the bus bars to detect a magnetic field strength generated by a current flowing through the corresponding bus bars. The magnetic detection element are gradient detection type magnetic detection elements that output a difference between magnetic field strengths detected at two magnetic sensing positions, respectively, and are arranged in such a manner that a detection axis direction thereof is perpendicular to a length direction of the bus bars and is tilted with respect to the plate thickness direction.

5 Claims, 3 Drawing Sheets

WHEN DIRECT CURRENT IS PASSED THROUGH THE FIRST BUS BAR
→THE MAGNETIC FLUX DENSITIES DETECTED AT TWO MAGNETIC SENSING POSITIONS OF THE FIRST MAGNETIC DETECTION ELEMENT

WHEN DIRECT CURRENT IS PASSED THROUGH THE FIRST BUS BAR
→THE MAGNETIC FLUX DENSITIES DETECTED AT TWO MAGNETIC SENSING POSITIONS OF THE SECOND MAGNETIC DETECTION ELEMENT

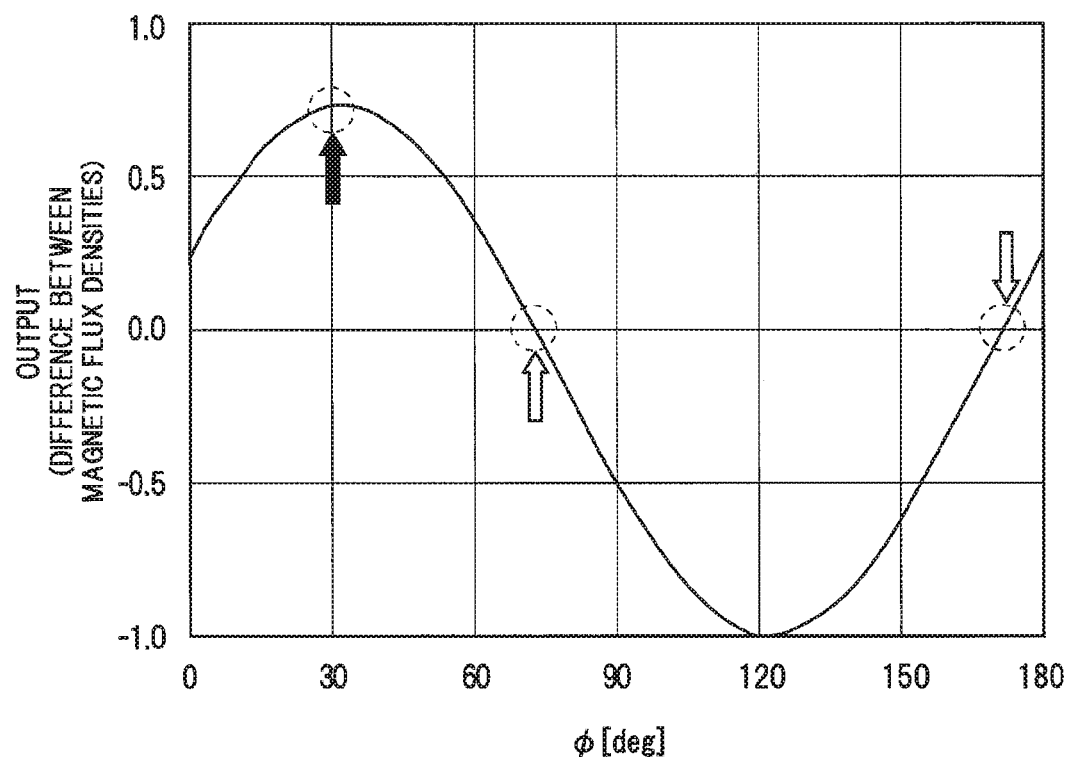

CURRENT SENSOR

BACKGROUND OF THE INVENTION

1. Field of the Invention

The present invention relates to a current sensor.

2. Description of the Related Art

Conventionally, as a current sensor, one having a magnetic detection element for detecting a strength of a magnetic field generated by a current to be measured is known (refer to e.g., JP-A-2016-200438). By detecting the strength of the magnetic field with the magnetic detection element, it is possible to calculate a current, based on the magnetic field strength.

In JP-A-2016-200438, there is described a current sensor that detects currents flowing through two bus bars (conductors) by using two magnetic detection elements, respectively. It is described that in this current sensor, the influence of the current flowing through the bus bar which is not a target of current detection is suppressed by disposing the magnetic detection elements so that a magnetic sensing direction straight line (straight line along a detection axis direction) faces the bus bar which is not a target of current detection, more preferably so that the magnetic sensing direction straight line (straight line along the detection axis direction) is orthogonal to the direction of the magnetic field caused by the current flowing through the bus bar which is not a target of current detection.

SUMMARY OF THE INVENTION

Now, the magnetic field detected by the magnetic detection elements includes disturbances such as a magnetic field generated from an adjacent device, geomagnetism, etc., in addition to the magnetic fields generated by the currents flowing through the bus bars. These disturbances can be reduced by providing a magnetic shield, but it is also considered that no sufficient shielding performance can be ensured for size reduction, weight reduction, and the like. In the current sensor described in JP-A-2016-200438, there is the problem that it is difficult to ensure sufficient accuracy when the influence of such disturbances cannot be ignored.

It is therefore an object of the present invention to provide a current sensor capable of suppressing a decrease in detection accuracy due to the influence of a disturbance and suppressing the influence of a current flowing through a bus bar which is not a target of current detection.

In order to solve the above problem, the present invention provides a current sensor, comprising:

two bus bars, each of which is formed in a plate shape, the two bus bars being aligned and arranged so as to be spaced apart from each other in a plate width direction thereof; and two magnetic detection elements arranged opposite the two bus bars, respectively, in a plate thickness direction of the bus bars to detect a magnetic field strength generated by a current flowing through the corresponding bus bars, wherein the two magnetic detection elements are gradient detection type magnetic detection elements that output a difference between magnetic field strengths detected at two magnetic sensing positions, respectively, and are arranged in such a manner that a detection axis direction thereof is perpendicular to a length direction of the bus bars and is tilted with respect to the plate thickness direction.

Points of the Invention

According to the present invention, there is provided the current sensor capable of suppressing a reduction in detection accuracy due to the influence of a disturbance and suppressing the influence of a current flowing through the bus bar which is not a target of current detection.

BRIEF DESCRIPTION OF THE DRAWINGS

FIG. 3 is a graph showing a change with the angle φ in the output of a second magnetic detection element when a direct current is passed through the first bus bar.

DETAILED DESCRIPTION OF THE PREFERRED EMBODIMENTS

Embodiment

An embodiment of the present invention will be described below with reference to the accompanying drawings.

Figure 1A:
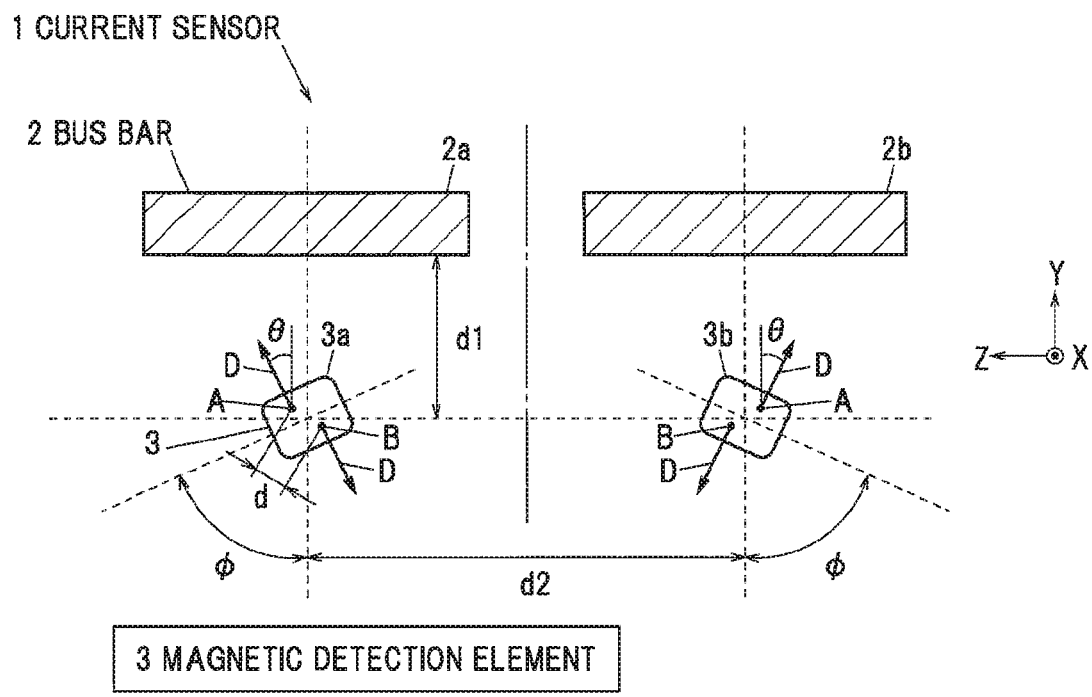
FIG. 1A is a cross-sectional view showing a cross section perpendicular to a longitudinal direction of a bus bar showing a current sensor according to one embodiment of the present invention.
Figure 1B:
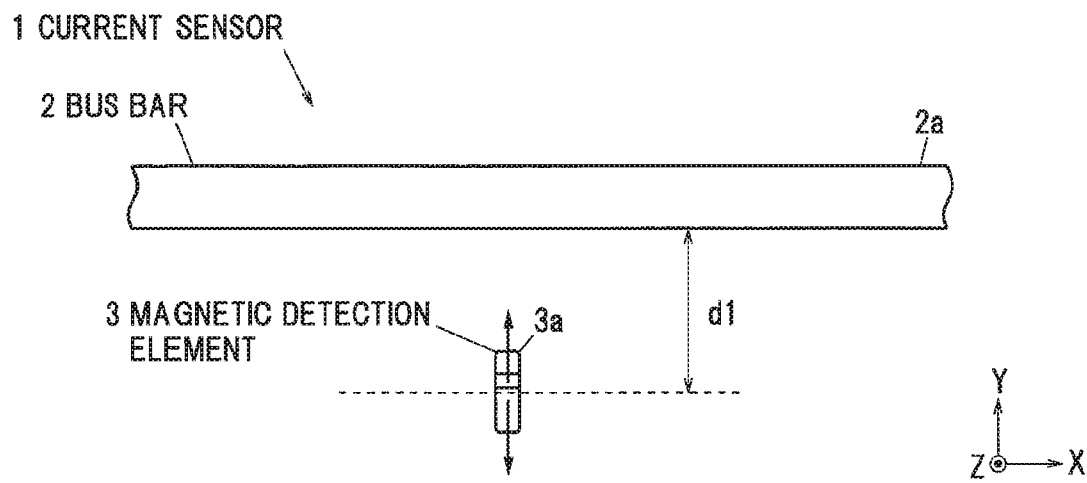
FIG. 1B is a side view thereof.

FIGS. 1A and 1B show a current sensor according to the present embodiment, where FIG. 1A is a sectional view showing a cross section perpendicular to a length direction of a bus bar, and FIG. 1B is a side view thereof. As shown in FIGS. 1A and 1B, a current sensor 1 includes two bus bars 2 and two magnetic detection elements 3.

Each of the bus bars 2 is a plate-like conductor made of a good electric conductor such as copper or aluminum, and serve as a current path through which current flows. In the present embodiment, independent single phase currents are conducted to the two bus bars 2 respectively. The two bus bars 2 are aligned and arranged so as to be spaced apart from each other in a plate width direction thereof, and current is made to flow along the length direction thereof. The thicknesses of the two bus bars 2 are, e.g., 3 mm Hereinafter, the bus bar 2 in the right side of FIG. 1A is referred to as a first bus bar 2a, and the left side bus bar 2 in FIG. 1A is referred to as a second bus bar 2b.

The magnetic detection elements 3 are provided for detecting the strengths of the magnetic fields generated by the currents flowing through the corresponding bus bars 2. The magnetic detection elements 3 are disposed so as to oppose the two bus bars 2 a and 2b respectively in a plate thickness direction of the bus bars 2 and are disposed so that the distances d1 along the plate thickness direction from the corresponding bus bars 2 are substantially equal. Hereinafter, the left-right direction in FIG. 1A is referred to as a width direction, and the up-and-down direction is referred to as a thickness direction, and the paper plane direction is referred to as a length direction. The length direction corresponds to an X axis direction shown, and the thickness direction corresponds to a Y axis direction shown, and the width direction corresponds to a Z axis direction shown. Further, the plate width direction of the bus bars 2 corresponds to the width direction, and the plate thickness direction of the bus bars 2 corresponds to the thickness direction. In this manner, in the current sensor 1, the two magnetic detection elements 3 are arranged side by side in the width direction (the Z direction).

Here, the distances d1 between the bus bars 2 and the magnetic detection elements 3 more specifically refer to the distance from the surfaces on the magnetic detection elements 3 side of the bus bars 2 to the center positions (the center positions in the width direction, the length direction, and the thickness direction) of the magnetic detection elements 3. The magnetic detection elements 3 are disposed so that the center positions of the magnetic detection elements 3 face the width direction center positions of the corresponding bus bars 2 in the thickness direction. Hereinafter, the magnetic detection element 3 disposed opposite (facing) the first bus bar 2a in the thickness direction will be referred to as the first magnetic detection element 3a, and the magnetic detection element 3 disposed opposite (facing) the second bus bar 2b in the thickness direction will be referred to as the second magnetic detection element 3b. Incidentally, it is preferable that the distance between the bus bar 2b and the magnetic detection element 3b is equal to the distance between the bus bar 2a and the magnetic detection element 3a. However, for example, it may be 0.99 to 1.01 times (in the case where they are substantially equal) due to manufacturing error and the like.

In the current sensor 1 according to the present embodiment, as the two magnetic detection elements 3a and 3b, a magnetic detection element of a gradient detection type having two magnetic sensing positions A and B to output a difference between magnetic field strengths detected at both the magnetic sensing positions respectively is used. As the two magnetic detection elements 3a and 3b, a GMR (Giant Magneto Resistive Effect) element of a gradient detection type for example can be used.

In the magnetic detection elements 3 of the gradient detection type, since the difference between the magnetic field strengths detected at the magnetic sensing positions A and B is outputted, the disturbances that can be regarded as a uniform distribution with respect to the space (such as magnetic fields from devices located at sufficiently far distances or geomagnetism) are canceled out. That is, by using the magnetic detection elements 3 of the gradient detection type, it is possible to suppress the deterioration of the detection accuracy due to the influence of the disturbances.

However, in the magnetic detection elements 3 of the gradient detection type, since the two magnetic sensing positions A and B are separated from each other, no same magnetic field strengths are detected at the magnetic sensing positions A and B for a disturbance having a near magnetic field generation position and a large magnetic field gradient at the positions of the magnetic detection elements 3. This would be a factor of a detection error. Therefore, the magnetic field generated in the bus bar 2 (hereinafter referred to as the adjacent bus bar 2) which is not a target of current detection would be a factor of a detection error.

Therefore, in the present embodiment, the two magnetic detection elements 3 are arranged in such a manner that their detection axis directions are perpendicular to the length direction and are tilted with respect to the thickness direction (the plate thickness direction of the bus bars 2). This makes it possible to equalize the magnetic fields from the adjacent bus bar 2 detected at the two magnetic sensing positions A and B of the magnetic detection elements 3 and makes it possible to suppress the influence of the magnetic field generated at the adjacent bus bar 2. In FIGS. 1A and 1B, the detection axis is denoted by character D.

Furthermore, in the present embodiment, the tilt angles θ (absolute value) of the detection axis directions with respect to the thickness directions in both the magnetic detection elements 3a and 3b are set at be substantially the same angles, and the tilt directions with respect to the plate thickness directions are set at the opposite directions. In the example of FIG. 1A, a case is shown where the detection axis direction of the first magnetic detection element 3a disposed in the left side of the figure is tilted in the counterclockwise direction and the detection axis direction of the second magnetic detection element 3b disposed in the right side of the drawing is tilted in the clockwise direction. However, the present invention is not limited to this, but it is also possible to tilt the detection axis direction of the first magnetic detection element 3a in the clockwise direction and tilt the detection axis direction of the second magnetic detection element 3b in the counterclockwise direction.

The two magnetic detection elements 3a and 3b are arranged so as to be symmetrical with respect to a plane having a normal direction in the width direction (a plane parallel to the thickness direction and the length direction, the XY plane). Incidentally, the symmetry here also includes that the magnetic sensing positions A and B of the two magnetic detection elements 3a and 3b are arranged symmetrically. In other words, the two magnetic detection elements 3a and 3b are arranged so that the magnetic sensing positions A and B are bilaterally symmetrical in a cross-sectional view perpendicular to the longitudinal direction. By symmetrically arranging the two magnetic detection elements 3a and 3b, it is possible to equalize the amplitudes of the magnetic flux densities detected by the two magnetic detection elements 3a and 3b, so the handling of the current sensor 1 (management of detection accuracy and the like) becomes easy.

(With Respect to the Tilt Angles θ of the Two Magnetic Detection Elements 3a and 3b)

In the case of using the magnetic detection elements 3 having a distance d between the magnetic sensing positions A and B of 1.2 mm, the magnetic field strengths detected at the magnetic sensing positions A and B of both the magnetic detection elements 3a and 3b when the tilt angles θ were varied were found by simulation. In the simulation, the distances d1 between the bus bars 2 and the magnetic detection elements 3 were set at 10 mm, and the arrangement pitches in the width direction of the bus bars 2 and the magnetic detection elements 3 (the distances between center positions in the width direction of the bus bars 2 and the magnetic detection elements 3) d2 were set at 20.5 mm, and the widths of both the bus bars 2 were 15 mm, and the thickness of both bus bars 2 were set at 3 mm.

Figure 2A:
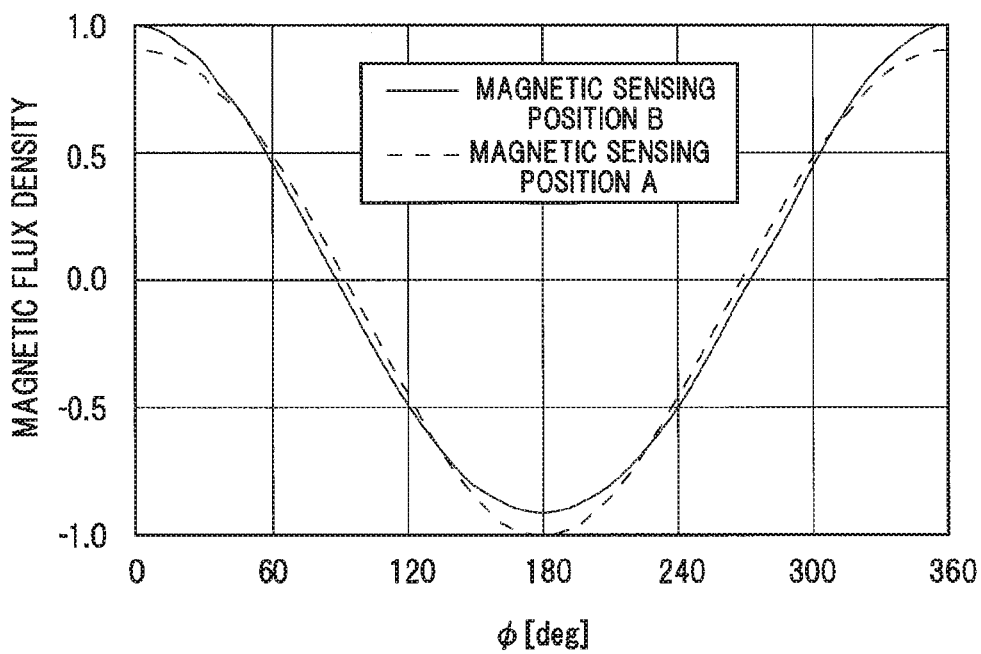
FIG. 2A is a graph showing changes with the angle φ of the magnetic field strengths detected at two magnetic sensing positions of a first magnetic detection element when a direct current is passed through a first bus bar.
Figure 2B:
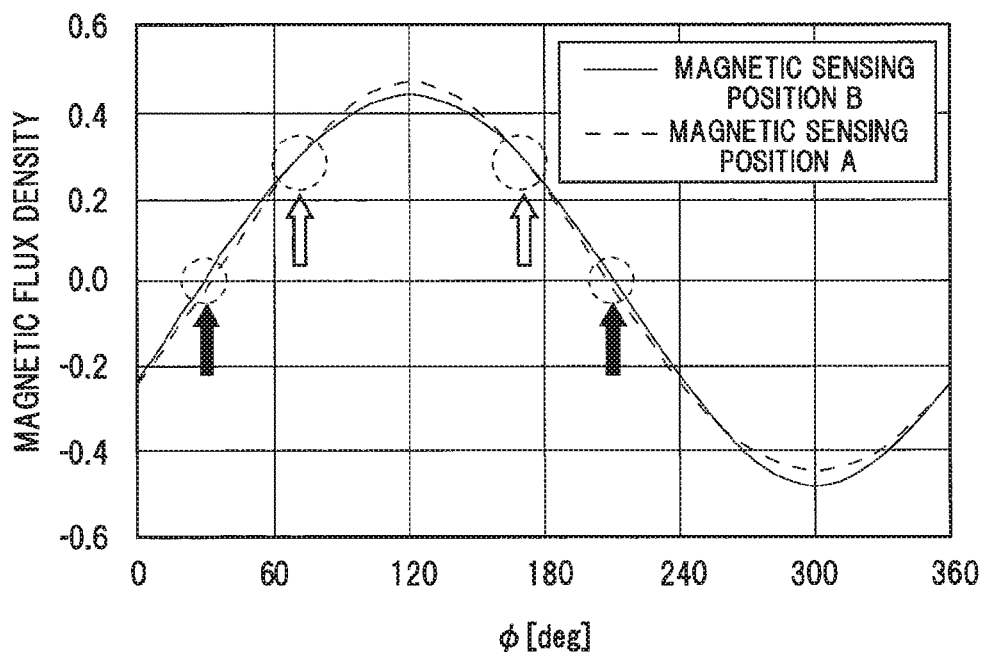
FIG. 2B is a graph showing changes with the angle φ of the magnetic field strengths detected at two magnetic sensing positions of a second magnetic detection element when a direct current is passed through the first bus bar.

FIG. 2A shows changes with the angle φ of the magnetic field strengths (magnetic flux densities) detected at the two magnetic sensing positions A and B of the first magnetic detection element 3a when a direct current is passed through the first bus bar 2a. Also, FIG. 2B is a graph showing changes with the angle φ of the magnetic field strengths (magnetic flux densities) detected at the two magnetic sensing positions A and B of the second magnetic detection element 3b when a direct current is passed through the first bus bar 2a. Further, FIG. 3 shows a change with the angle φ in the output (the difference between the magnetic flux densities at the magnetic sensing positions A and B) of the second magnetic detection element 3b when a direct current is passed through the first bus bar 2a. Note that the angle φ is the angle between the direction perpendicular to the detection axis direction and the thickness direction, and is represented by $\phi=90-\theta$ (see FIG. 1A).

In FIGS. 2A and 2B, the magnetic flux density on the vertical axis is normalized with reference to the magnetic flux density detected at the magnetic sensing position B of the first magnetic detecting element $3a$ when $\phi=0$ degrees. Also, in FIG. 3, the difference between the magnetic flux densities on the vertical axis is normalized at a value at which the absolute value is maximum (the difference in the magnetic flux density at an angle $\phi$ of about 120 degrees).

As shown in FIG. 2A, when an electric current is flowing through the corresponding first bus bar $2a$, when the angle $\phi$ (the tilt angle $\theta$) of the first magnetic detection element $3a$ is changed, the magnetic fluxes detected at both the magnetic sensing positions A and B periodically change. Note that in FIG. 2A, the magnetic flux densities detected at the magnetic sensing positions A and B of the first magnetic detecting element $3a$ when a current is passed through the first bus bar $2a$ are shown, but when a current is passed through the second bus bar $2b$, the magnetic flux densities detected at the magnetic sensing positions A and B of the second magnetic detecting element $3b$ also have the same characteristics.

On the other hand, as shown in FIG. 2B, even when a current is flowing through the noncorresponding first bus bar $2a$, the magnetic flux density is detected at the magnetic sensing positions A and B of the second magnetic detection element $3b$. Also in this case, when the angle $\phi$ (the tilt angle $\theta$) of the second magnetic detection element $3b$ is changed, similarly to FIG. 2A, the magnetic fluxes detected at the both magnetic sensing positions A and B periodically change. As shown in FIG. 3, the output of the second magnetic detection element $3b$, that is, the difference between the magnetic flux densities detected at the both magnetic sensing positions A and B, also changes periodically when the angle $\phi$ (the tilt angle $\theta$) of the second magnetic detection element $3b$ is changed. Note that in FIGS. 2B and 3, the magnetic flux densities detected at the magnetic sensing positions A and B of the first magnetic detecting element $3b$ and the difference therebetween when a current is passed through the first bus bar $2a$ are shown, but when a current is passed through the second bus bar $2b$, the magnetic flux densities detected at the magnetic sensing positions A and B of the second magnetic detecting element $3b$ and the difference therebetween also have the same characteristics.

Here, as indicated by outlined arrows in FIGS. 2B and 3, in this example, the magnetic flux densities detected at the two magnetic sensitive positions A and B have the same values at the angles $\phi$ of about 70 degrees and about 170 degrees (the tilt angle $\theta$ is about 20 degrees and about −80 degrees), and the output (the difference between the magnetic flux densities detected at the two magnetic sensing positions A and B) becomes substantially zero. That is, by setting the angle $\phi$ at about 70 degrees or about 170 degrees, it is possible to suppress the influence of the magnetic field from the adjacent bus bar 2.

Incidentally, in the conventional technique in which the magnetic detection element is arranged so that the direction of the detection axis is orthogonal to the direction of the magnetic field from the adjacent bus bar 2, as indicated by the solid arrow in FIG. 2B, the angle $\phi$ (the tilt angle $\theta$) is set at an angle at which the detected magnetic field strength becomes 0. In this example, the angle is set at about 30 degrees or about 210 degrees. However, as indicated by the solid arrow in FIG. 3, at this angle, the difference between the magnetic flux densities detected at the two magnetic sensing positions A and B does not become zero and the influence of the magnetic field from the adjacent bus bar 2 cannot be suppressed. In this example, when the angle $\phi$ is set according to the conventional technique, the output of the second magnetic detection element $3b$ becomes substantially the maximum value, and the influence of the magnetic field from the adjacent bus bar 2 becomes very large.

The characteristics shown in FIGS. 2 and 3 vary depending on the distances d between the magnetic sensing positions A and B of the magnetic detection elements 3, the distances d1 between the bus bars 2 and the magnetic detection elements 3, the arrangement pitches d2 in the width direction of the bus bars 2 and the magnetic detection elements 3, etc., and the optimum tilt angle $\theta$ (angle $\phi$) also changes accordingly. Therefore, in consideration of the arrangement of the bus bars 2 and the magnetic detection elements 3 and the like, it is preferable to set the tilt angle $\theta$ (angle $\phi$) at which the influence of the magnetic field from the adjacent bus bar 2 is minimized.

The ratio Db/Da×100 of the difference Db between the magnetic field strengths detected at the two magnetic sensing positions A and B by the current flowing through the noncorresponding bus bar 2 (the adjacent bus bar 2) to the difference Da between the magnetic field strengths detected at the two magnetic sensing positions A and B by the current flowing through the corresponding bus bar 2 is desirably 0.5% or less, more desirably 0.1% or less. In other words, the tilt angle $\theta$ is preferably set at an angle at which the ratio Db/Da×100 is 0.5% or less, more preferably 0.1% or less.

Operation and Advantageous Effects of the Embodiment

As described above, in the current sensor 1 according to the present embodiment, the two magnetic detection elements $3a$ and $3b$ are magnetic detection elements of the gradient detection type for outputting the difference between the magnetic field strengths detected at the two magnetic sensitive positions A and B, respectively, and are disposed in such a manner that the detection axis direction thereof is perpendicular to the length direction of the bus bars 2 and is tilted with respect to the plate thickness direction of the bus bars 2.

By using the two magnetic detection elements $3a$ and $3b$ of the gradient detection type, it is possible to suppress the influence of the disturbance which can be regarded as a uniform distribution with respect to the space. Furthermore, by disposing the two magnetic detection elements $3a$ and $3b$ so that the direction of the detection axis is tilted with respect to the thickness direction, it is possible to equalize the influences of the magnetic field generated by the adjacent bus bar 2 at the two magnetic sensing positions A and B, and cancel these out. That is, according to the present embodiment, it is possible to realize the current sensor 1 capable of suppressing the deterioration of the detection accuracy due to the influence of the disturbance and suppressing the influence of the current flowing through the bus bar 2 which is not a target of current detection, thereby contributing to an improvement in the detection accuracy of the current sensor 1.

Further, by tilting the detection axis direction of the two magnetic detection elements $3a$ and $3b$ with respect to the thickness direction, the detection sensitivity at the magnetic sensing positions A and B of the two magnetic detection elements $3a$ and $3b$ can be suppressed, so it is possible to dispose the magnetic detection elements 3 *a* and 3 *b* more in the vicinity of the bus bars 2, contributing to size reduction of the current sensor 1.

(Modifications)

In the above embodiment, there has been described the case where the distance between the first bus bar 2*a* and the first magnetic detection element 3*a* is equal to the distance between the second bus bar 2*b* and the second magnetic detection element 3*b*. However, the present invention is not limited to this, but these distances may be different. Also in this case, as in the above embodiment, it is desirable that both the magnetic detection elements 3*a* and 3*b* are arranged so that the ratio Db/Da×100 is 0.5% or less. It is more desirable that both the magnetic detection elements 3*a* and 3*b* are arranged so that the ratio Db/Da×100 is 0.1% or less. That is, in this case, the tilt angle of the first magnetic detection element 3*a* is different from the tilt angle of the second magnetic detection element 3*b*. Note that the tilt directions of the two magnetic detection elements 3 with respect to the thickness direction are arranged so as to be the opposite directions, as in the above embodiment.

In the above embodiment, the case where the two bus bars 2 and the two magnetic detection elements 3 are used has been described. However, the present invention is not limited to this case. Even when only one bus bar and one magnetic detection element 3 are provided, the advantageous effects of the present invention can be obtained. That is, in the case where a magnetic field generation source is present in the vicinity of the magnetic detection element 3, by disposing the gradient detection type magnetic detection element 3 at a tilt angle with respect to the thickness direction of the bus bar 2, it is possible to equalize the influences of the magnetic field generating source at the magnetic sensing positions A and B, cancel them out, and suppress the influences from the above mentioned magnetic field generation source.

In addition, although not mentioned in the above embodiment, a pair of shield plates may be provided so as to sandwich the bus bars 2 and the magnetic detection elements 3 from the thickness direction to further suppress the influences due to the disturbances. Further, the bus bars 2 and the magnetic detection elements 3 may be covered with a mold resin.

SUMMARY OF THE EMBODIMENT

Next, the technical ideas grasped from the above-described embodiments will be described with the aid of reference numerals and the like in the embodiments. It should be noted, however, that each of the reference numerals and the like in the following description does not limit the constituent elements in the claims to the members and the like specifically shown in the embodiments.

[1] A current sensor (1), comprising:
two bus bars (2), each of which is formed in a plate shape, the two bus bars (2) being aligned and arranged so as to be spaced apart from each other in a plate width direction thereof; and
two magnetic detection elements (3) arranged opposite the two bus bars (2), respectively, in a plate thickness direction of the bus bars (2) to detect a magnetic field strength generated by a current flowing through the corresponding bus bars (2),
wherein the two magnetic detection elements (3) are gradient detection type magnetic detection elements (3) that output a difference between magnetic field strengths detected at two magnetic sensing positions (A, B), respectively, and are arranged in such a manner that a detection axis direction thereof is perpendicular to a length direction of the bus bars (2) and is tilted with respect to the plate thickness direction.

[2] The current sensor according to [1] above, wherein the two magnetic detection elements (3) are arranged so that their distances from the corresponding bus bars (2) in the plate thickness direction are substantially equal.

[3] The current sensor (1) according to [1] or [2] above, wherein the two magnetic detection elements (3) are arranged substantially symmetrically with respect to a plane having a normal direction in the plate width direction.

[4] The current sensor (1) according to any one of [1] to [3] above, wherein the tilt angles of the two magnetic detection elements (3) are an angle at which a ratio Db/Da× 100 of a difference Db between magnetic field strengths detected at the two magnetic sensing positions (A, B) by a current flowing through noncorresponding bus bars to the difference Da between the magnetic field strengths detected at the two magnetic sensing positions (A, B) by the current flowing through the corresponding bus bars (2) is 0.5% or less.

[5] A current sensor, comprising:
a bus bar (2), which is formed in a plate shape; and
a magnetic detection element (3) disposed opposite the bus bar (2) in a plate thickness direction of the bus bar (2) to detect a magnetic field strength generated by a current flowing through the bus bar (2),
wherein the magnetic detection element (3) is a gradient detection type magnetic detection element (3) that outputs a difference between the magnetic field strengths detected at two magnetic sensing positions (A, B), respectively, and is disposed in such a manner that a detection axis direction thereof is perpendicular to a length direction of the bus bar (2) and is tilted with respect to the plate thickness direction.

Although the embodiment of the present invention has been described above, the embodiment described above does not limit the invention according to the claims. It should also be noted that not all combinations of the features described in the embodiments are indispensable to the means for solving the problem of the invention. Further, the present invention can be appropriately modified and carried out within the scope not deviating from the spirit thereof.

What is claimed is:

1. A current sensor, comprising:
two bus bars, each of which is formed in a plate shape, the two bus bars being aligned and arranged so as to be spaced apart from each other in a plate width direction thereof; and
two magnetic detection elements arranged opposite the two bus bars, respectively, in a plate thickness direction of the bus bars to detect a magnetic field strength generated by a current flowing through the corresponding bus bars,
wherein the two magnetic detection elements are gradient detection type magnetic detection elements that output a difference between magnetic field strengths detected at two magnetic sensing positions, respectively, and are arranged in such a manner that a detection axis direction thereof is perpendicular to a length direction of the bus bars and is tilted with respect to the plate thickness direction.

2. The current sensor according to claim 1, wherein the two magnetic detection elements are arranged so that their distances from the corresponding bus bars in the plate thickness direction are substantially equal.

3. The current sensor according to claim 1, wherein the two magnetic detection elements are arranged substantially symmetrically with respect to a plane having a normal direction in the plate width direction.

4. The current sensor according to claim 1, wherein the tilt angles of the two magnetic detection elements are an angle at which a ratio Db/Da×100 of a difference Db between magnetic field strengths detected at the two magnetic sensing positions by a current flowing through noncorresponding bus bars to the difference Da between the magnetic field strengths detected at the two magnetic sensing positions by the current flowing through the corresponding bus bars is 0.5% or less.

5. A current sensor, comprising:
   a bus bar, which is formed in a plate shape; and
   a magnetic detection element disposed opposite the bus bar in a plate thickness direction of the bus bar to detect a strength of a magnetic field generated by a current flowing through the bus bar,
   wherein the magnetic detection element is a gradient detection type magnetic detection element that outputs a difference between the magnetic field strengths detected at two magnetic sensing positions, respectively, and is disposed in such a manner that a detection axis direction thereof is perpendicular to a length direction of the bus bar and is tilted with respect to the plate thickness direction.

\* \* \* \* \*